(12) United States Patent
Jang

(10) Patent No.: US 11,302,620 B2
(45) Date of Patent: Apr. 12, 2022

(54) CIRCUIT BOARD AND METHOD FOR MANUFACTURING THE SAME

(71) Applicant: Samsung Display Co., Ltd., Yongin-Si (KR)

(72) Inventor: Joo-Nyung Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/806,160

(22) Filed: Mar. 2, 2020

(65) Prior Publication Data

US 2020/0312761 A1 Oct. 1, 2020

(30) Foreign Application Priority Data

Mar. 25, 2019 (KR) .......................... 10-2019-0033824

(51) Int. Cl.
*H01L 23/498* (2006.01)
*H01L 21/48* (2006.01)
*H01L 27/32* (2006.01)

(52) U.S. Cl.
CPC .... *H01L 23/49838* (2013.01); *H01L 21/4846* (2013.01); *H01L 23/4985* (2013.01); *H01L 23/49866* (2013.01); *H01L 27/3276* (2013.01)

(58) Field of Classification Search
CPC ........... H01L 23/49838; H01L 23/4985; H01L 23/49866; H01L 27/3276
See application file for complete search history.

(56) References Cited

U.S. PATENT DOCUMENTS

| | | | |
|---|---|---|---|
| 2009/0174083 A1* | 7/2009 | Sunohara | .......... H01L 23/49811 257/778 |
| 2013/0313695 A1* | 11/2013 | Noichi | .............. H01L 23/49582 257/668 |
| 2018/0217466 A1* | 8/2018 | Nomura | .............. G02F 1/13452 |
| 2018/0226326 A1* | 8/2018 | Uchiyama | ......... H01L 23/49524 |
| 2020/0091270 A1 | 3/2020 | Jang | |

FOREIGN PATENT DOCUMENTS

| | | |
|---|---|---|
| JP | 4113767 B2 | 7/2008 |
| KR | 1020100073924 A | 7/2010 |
| KR | 1020170136421 A | 12/2017 |
| KR | 1020200032792 A | 3/2020 |
| KR | 1020200115756 A | 10/2020 |

\* cited by examiner

*Primary Examiner* — Peniel M Gumedzoe
(74) *Attorney, Agent, or Firm* — Cantor Colburn LLP

(57) ABSTRACT

A circuit board includes a board, first connection pads disposed on the board and arranged in a first direction, second connection pads disposed on the board and arranged in the first direction, a driving chip disposed on the board and between the first connection pads and the second connection pads, and a first adhesive layer disposed on the board and overlapping with an entirety of the first connection pads in a plan view. The second connection pads are spaced apart from the first connection pads in a second direction perpendicular to the first direction.

12 Claims, 14 Drawing Sheets

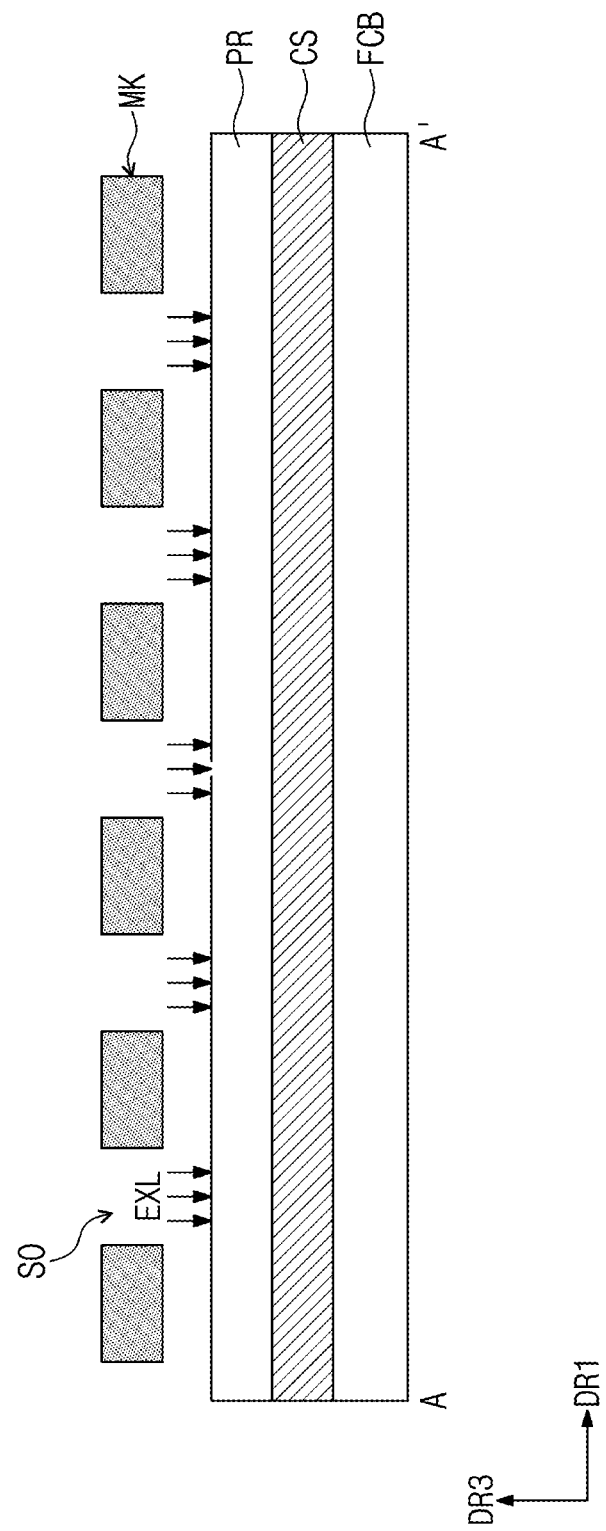

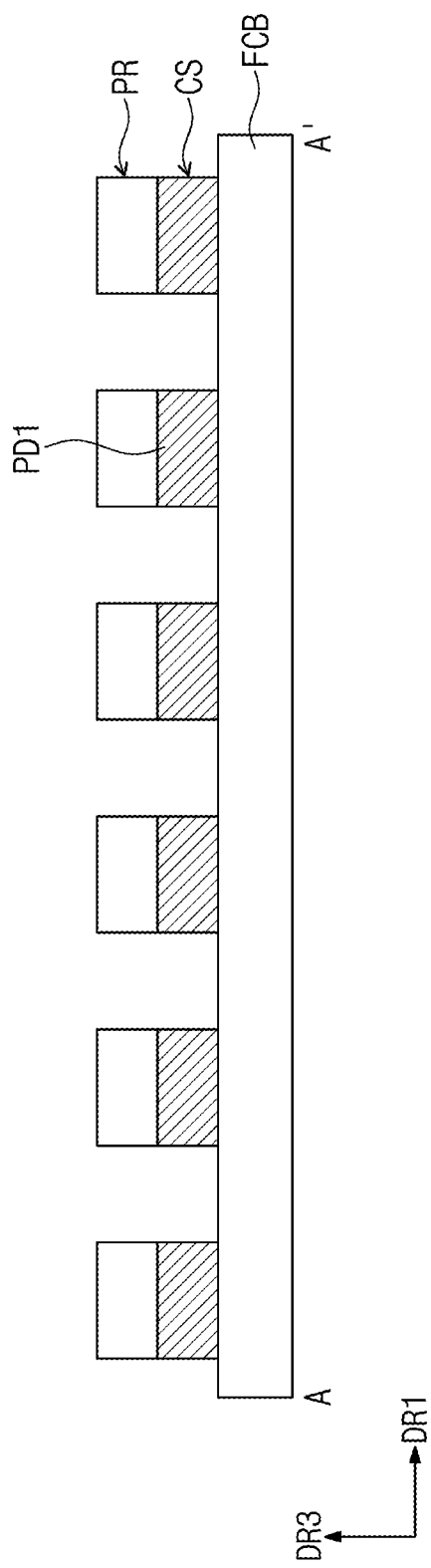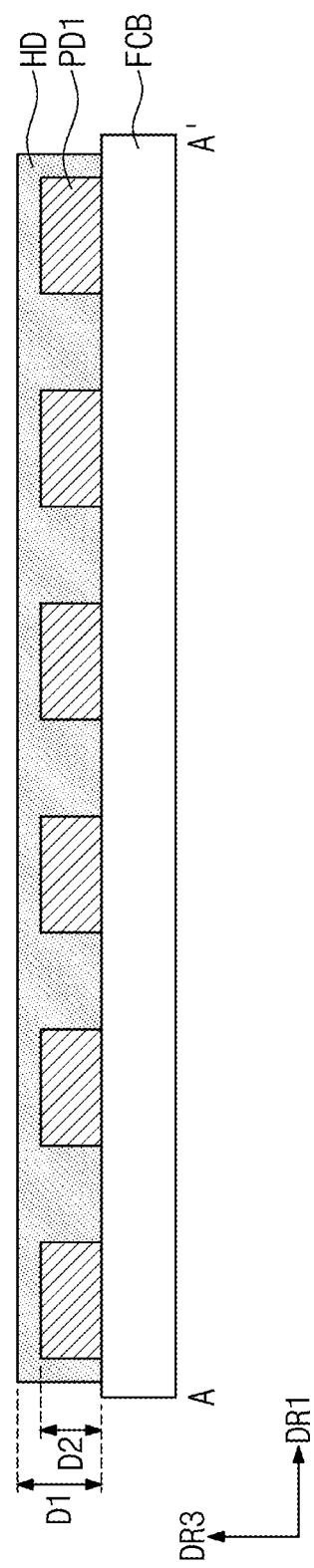

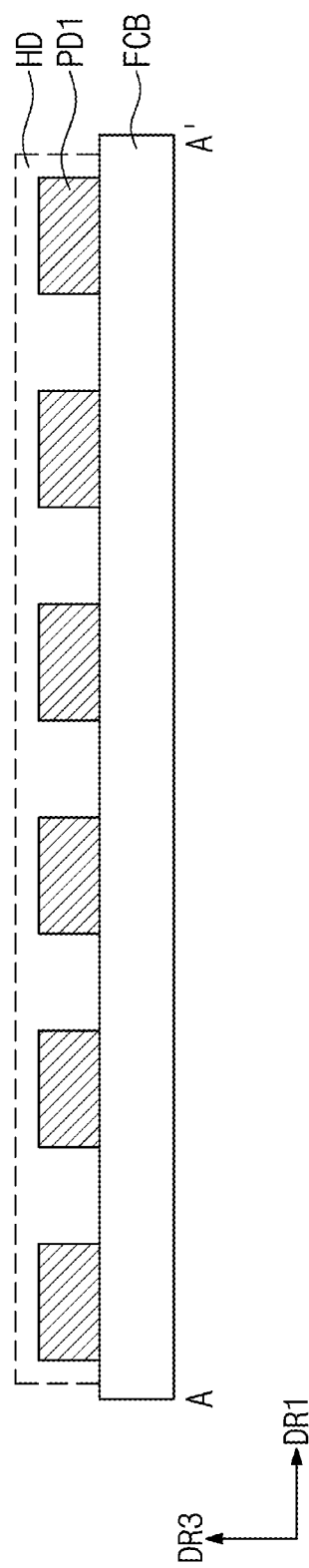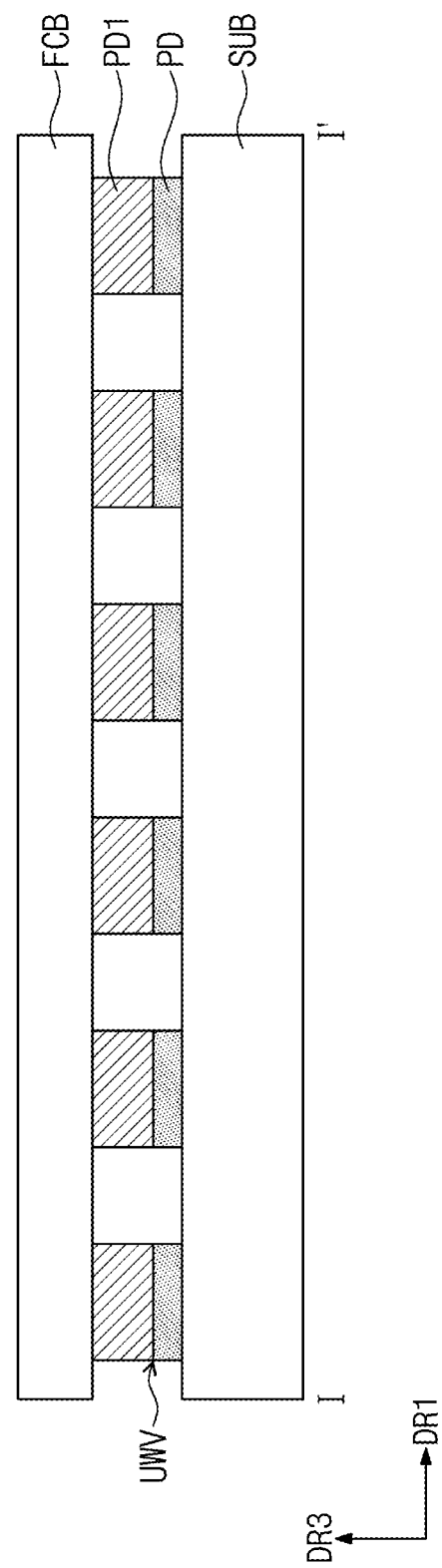

CIRCUIT BOARD AND METHOD FOR MANUFACTURING THE SAME

This application claims priority to Korean Patent Application No. 10-2019-0033824, filed on Mar. 25, 2019, the content of which in its entirety is herein incorporated by reference.

BACKGROUND

The present disclosure herein relates to a circuit board, and more particularly, to a circuit board having flexibility and a method for manufacturing the same.

Various display devices used in multimedia devices such as televisions, portable phones, tablet computers, navigation systems, and game consoles have been developed.

A display device may include a display panel for displaying an image. The display panel may include a plurality of gate lines, a plurality of data lines, and a plurality of pixels connected to the plurality of gate lines and the plurality of data lines. The display panel may be connected to a circuit board that provides electrical signals required for displaying an image to the gate lines or the data lines.

SUMMARY

The circuit board may be connected to the display panel by an anisotropic conductive film or an ultrasonic bonding method. The method of connecting the display panel and the circuit board by the ultrasonic bonding method may increase conductivity and may simplify manufacturing processes, as compared with the method using the anisotropic conductive film.

The present disclosure may provide a circuit board connected to a display panel by an ultrasonic bonding method, and a method for manufacturing the same.

In an exemplary embodiment of the inventive concepts, a circuit board includes a board, first connection pads disposed on the board and arranged in a first direction, where second connection pads are disposed on the board and arranged in the first direction, the second connection pads spaced apart from the first connection pads in a second direction perpendicular to the first direction, a driving chip disposed on the board and between the first connection pads and the second connection pads, and a first adhesive layer disposed on the board and overlapping with an entirety of the first connection pads in a plan view.

In an exemplary embodiment, the first adhesive layer may overlap with an area between the first connection pads in the plan view.

In an exemplary embodiment, the first adhesive layer overlapping with the area between the first connection pads may be disposed directly on the board, and a thickness of the first adhesive layer overlapping with the area between the first connection pads may be greater than a thickness of each of the first connection pads.

In an exemplary embodiment, the first adhesive layer may be spaced apart from the board and may be disposed on the first connection pads.

In an exemplary embodiment, each of the first connection pads may include a first conductive layer disposed between the board and the first adhesive layer, and a second conductive layer disposed between the board and the first adhesive layer, the second conductive layer may have a different material from the material of the first conductive layer and surrounds a side surface of the first conductive layer.

In an exemplary embodiment, the first adhesive layer may have a tape shape, and the first adhesive layer may overlap with the first connection pads in neither the first direction nor the second direction.

In an exemplary embodiment, the first connection pads may consist of a metal of a single material.

In an exemplary embodiment, the circuit board may further include first signal lines disposed between the driving chip and the first connection pads to electrically connect the first connection pads to the driving chip, and second signal lines disposed between the driving chip and the second connection pads to electrically connect the second connection pads to the driving chip.

In an exemplary embodiment, each of the first signal lines may include a first line layer which consists of the same material as a material of the first connection pads and is disposed on the board, and a second line layer disposed on the first line layer and which consists of a different material from a material of the first line layer. The first line layer and the first connection pad may constitute a single unitary body.

In an exemplary embodiment, a thickness of the second line layer may be less than a thickness of the first line layer.

In an exemplary embodiment, the first line layer may include copper, and the second line layer may include tin.

In an exemplary embodiment, the second connection pads may consist of a metal of a single material, and the circuit board may further include a second adhesive layer overlapping with an entirety of the second connection pads in the plan view and disposed on the second connection pads.

In an exemplary embodiment, each of the second signal lines may include a third line layer which consists of the same material as a material of the second connection pads and is disposed on the board, and a fourth line layer disposed on the third line layer and which consists of a different material from a material of the third line layer. The third line layer and the second connection pad may constitute a single unitary body.

In an exemplary embodiment of the inventive concepts, a method for manufacturing a circuit board includes forming first conductive pads spaced apart from each other and arranged in one direction and first conductive lines connected to the first conductive pads, respectively, on a board, forming an adhesive layer overlapping with the entire first conductive pads, on the first conductive pads, and forming second conductive lines having a different material from a material of the first conductive lines, on the first conductive lines. The first conductive pads and the first conductive lines are formed of the same material, and the second conductive lines do not overlap with the first conductive pads in a plan view.

In an exemplary embodiment, the adhesive layer may be formed by applying an adhesive material onto the board.

In an exemplary embodiment, the adhesive layer may overlap with the entire first conductive pads and an entire area between the first conductive pads in a plan view, and a thickness of the adhesive layer overlapping with the area between the first conductive pads may be greater than a thickness of each of the first conductive pads.

In an exemplary embodiment, the adhesive layer may be provided in a tape shape of a single unitary body and may be disposed on the first conductive pads. The adhesive layer may be spaced apart from the board.

In an exemplary embodiment, a length from the board to a top surface of the adhesive layer may be greater than a length from the board to a top surface of each of the first conductive pads.

In an exemplary embodiment, an auxiliary conductive layer having the same material as a material of the second conductive lines may be formed on a side surface of each of the first conductive pads.

In an exemplary embodiment, the first conductive pads may be formed of a single material.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings:

FIGS. 8A to 8E are cross-sectional views illustrating an exemplary embodiment of a method for manufacturing a circuit board according to the inventive concepts;

FIGS. 9A and 9B are cross-sectional views illustrating an exemplary embodiment of an ultrasonic bonding method between a circuit board and a display panel, according to the inventive concepts.

DETAILED DESCRIPTION OF THE EMBODIMENTS

Figure 1:
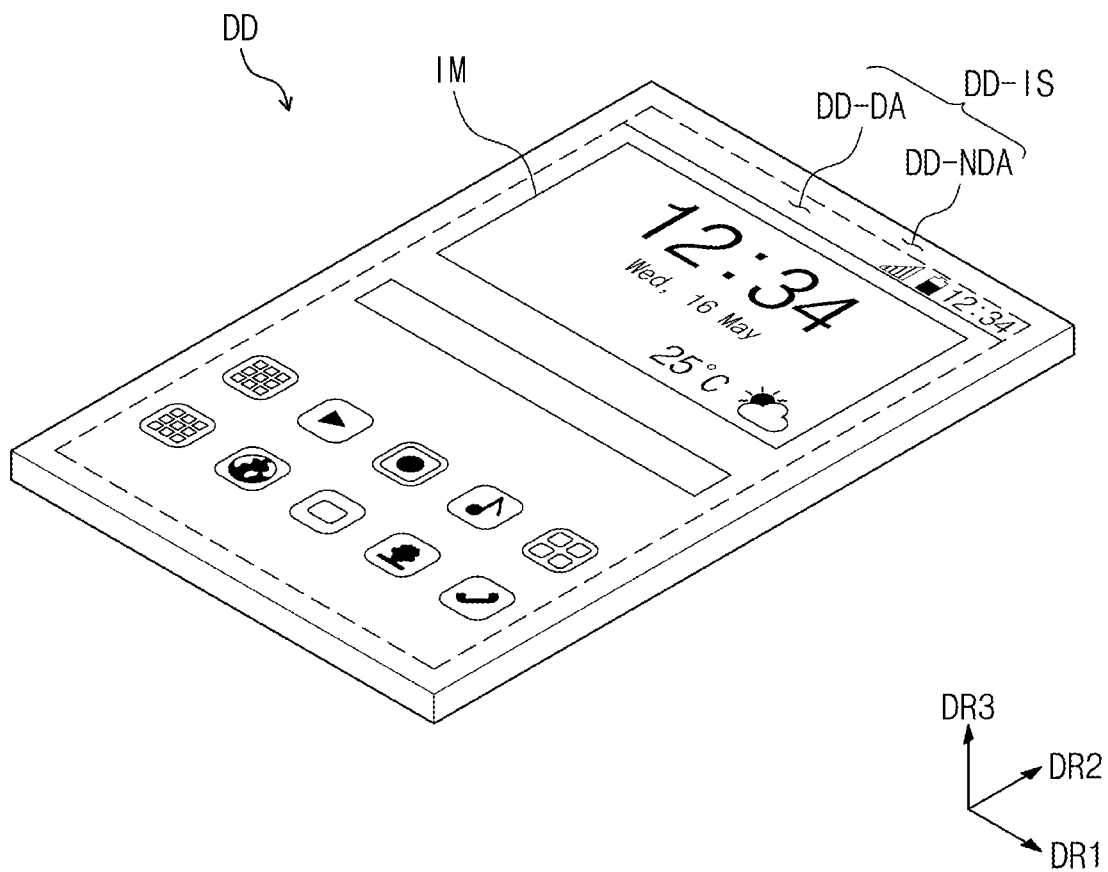
FIG. 1 is a perspective view illustrating an exemplary embodiment of a display device according to the inventive concepts.

The inventive concepts now will be described more entirely hereinafter with reference to the accompanying drawings, in which various embodiments are shown. The inventive concepts may, however, be embodied in many different forms, and should not be construed as limited to the embodiments set forth herein. Rather, these embodiments are provided so that this disclosure will be thorough and complete, and will entirely convey the scopes of the inventive concepts to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the inventive concepts will be described in detail with reference to the accompanying drawings.

Figure 2:
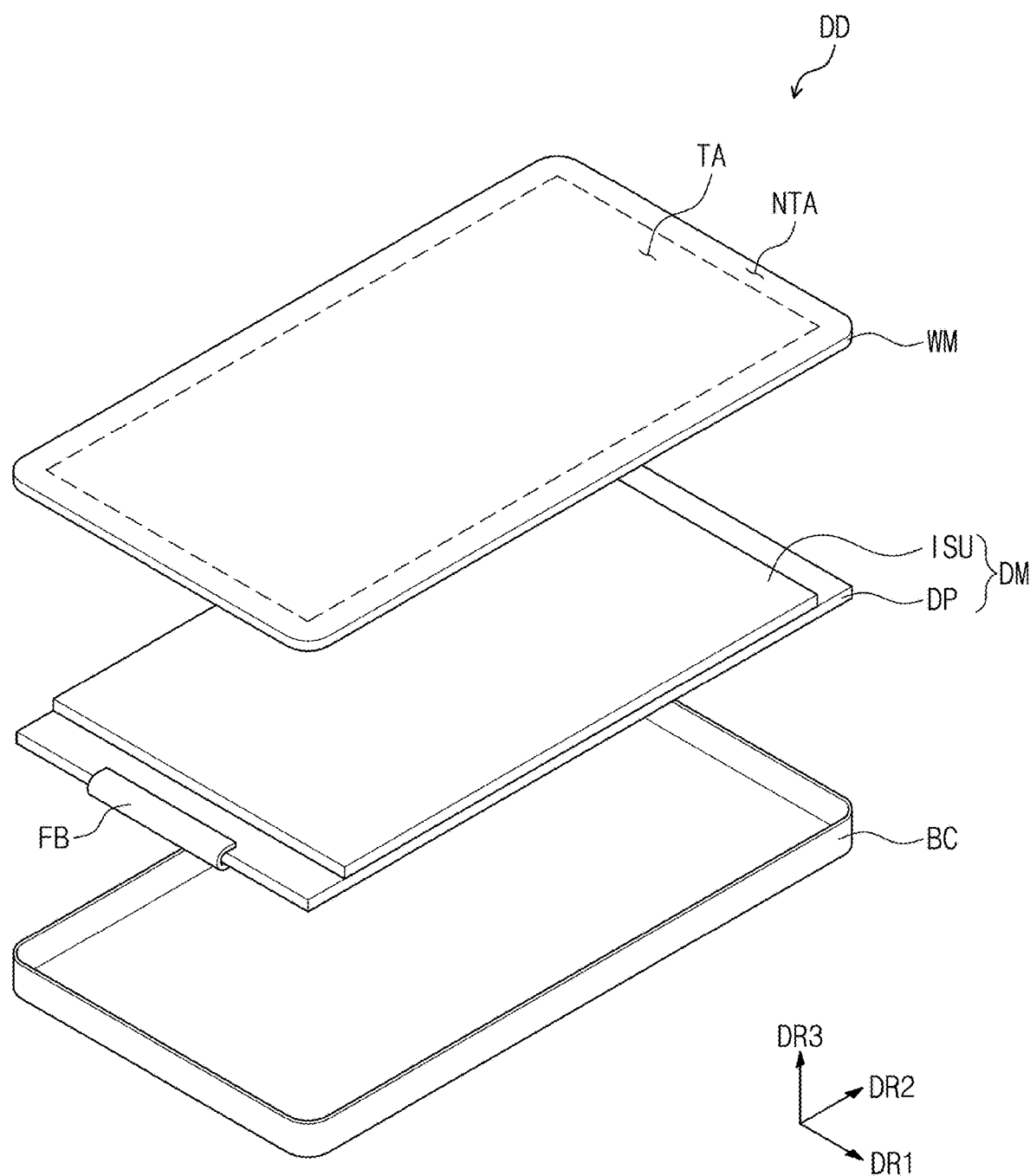
FIG. 2 is an exploded perspective view illustrating an exemplary embodiment of a display device according to the inventive concepts.

FIG. 1 is a perspective view illustrating an exemplary embodiment of a display device according to the inventive concepts. FIG. 2 is an exploded perspective view illustrating an exemplary embodiment of a display device according to the inventive concepts.

Referring to FIG. 1, a display device DD may display an image IM through a display surface DD-IS. In this exemplary embodiment, the display device DD including a flat display surface DD-IS is illustrated. However, the inventive concepts are not limited thereto. In other exemplary embodiments, the display device DD may include a curved display surface or a three-dimensional ("3D") display surface. The 3D display surface may include a plurality of display areas extending in different directions from each other. For example, the 3D display surface may include a polygonal pillar-shaped display surface.

In an exemplary embodiment, the display device DD may be a flexible display device. However, the inventive concepts are not limited thereto. In another exemplary embodiment, the display device DD may be a rigid display device.

In addition, even though not shown in the drawings, electronic modules, a camera module and a power module, which are mounted on a main board, may be disposed together with the display device DD in a bracket and/or a case to constitute a mobile phone. The display device DD according to the inventive concepts may be a large-sized electronic device (e.g., television and monitor) and a small or middle-sized electronic device (e.g., tablet, car navigation unit, game console, and smart watch).

The display surface DD-IS may be parallel to a plane defined by a first direction DR1 and a second direction DR2 as shown in FIG. 1. A normal direction of the display surface DD-IS (i.e., a thickness direction of the display device DD) may be indicated by a third direction DR3. In the present specification, it may be understood that when one or more components are viewed in a plan view, it or they may be viewed in a direction opposite to the third direction DR3. In addition, a planar area or size may mean an area or size when viewed in the direction opposite to the third direction DR3. A front surface (or a top surface) and a rear surface (or a bottom surface) of each of members or units described hereinafter may be defined using the third direction DR3. However, the first to third directions DR1, DR2 and DR3 in exemplary embodiments are illustrated as an example of the inventive concepts, and directions indicated by the first to third directions DR1, DR2 and DR3 are perpendicular to each other. However, the directions indicated by the first to third directions DR1, DR2 and DR3 may be changed into opposite directions, in another exemplary embodiment.

As illustrated in FIG. 1, the display surface DD-IS may include a display area DD-DA in which the image IM is displayed, and a non-display area DD-NDA adjacent to the display area DD-DA. An image may not be displayed in the non-display area DD-NDA. In FIG. 1, application icons and a clock box are illustrated as an example of the image IM.

In this exemplary embodiment, the display area DD-DA may have a rectangular shape, and the non-display area DD-NDA may have a shape surrounding the display area DD-DA in a plan view. However, the inventive concepts are not limited thereto. The shapes of the display area DD-DA and the non-display area DD-NDA may be variously designed. For example, the non-display area DD-NDA may be disposed adjacent to only one side of the display area DD-DA or may be omitted in another exemplary embodiment.

Referring to FIG. 2, the display device DD may include a window WM, a display module DM, a circuit board FB, and a receiving member BC.

The window WM may be disposed on the display module DM and may transmit an image, provided from the display module DM, through a transmission area TA. The window WM may include the transmission area TA and a non-transmission area NTA. The transmission area TA may have a shape corresponding to that of the display area DD-DA illustrated in FIG. 1. In other words, the image IM displayed in the display area DD-DA of the display device DD may be visible to the outside through the transmission area TA of the window WM.

The non-transmission area NTA may have a shape corresponding to that of the non-display area DD-NDA illustrated in FIG. 1. A light transmittance of the non-transmission area NTA may be less than a light transmittance of the transmission area TA. However, the inventive concepts are not limited thereto. In another exemplary embodiment, the non-transmission area NTA may be omitted.

For example, the window WM may include or be formed of glass, sapphire, or plastic. Even though the window WM is illustrated as a single layer in FIG. 2, alternatively, the window WM may include a plurality of layers. In an exemplary embodiment, the window WM may include a base layer and at least one printed layer disposed on a rear surface of the base layer. The printed layer may overlap with the non-transmission area NTA in a plan view. The printed layer may have a predetermined color. For example, the printed layer may have a black color or may have another color different from the black color.

The display module DM may be disposed between the window WM and the receiving member BC. The display module DM may include a display panel DP and an input sensing unit ISU.

The display panel DP may generate an image and may provide the generated image to the window WM. According to some exemplary embodiments of the inventive concepts, the display panel DP may be, but not limited to, an organic light emitting display panel, a liquid crystal display panel, or a quantum-dot light emitting display panel. For example, the organic light emitting display panel may include organic light emitting elements. The liquid crystal display panel may include liquid crystal molecules. The quantum-dot light emitting display panel may include quantum dots or quantum rods.

The case in which the display panel DP is the organic light emitting display panel will be described hereinafter as an example. However, inventive concepts are not limited thereto. In other words, other various display panels may be applied to exemplary embodiments of the inventive concepts.

The input sensing unit ISU may be disposed between the window WM and the display panel DP. The input sensing unit ISU may sense an external input provided from the outside. The external input provided from the outside may have various forms. For example, the external input may include at least one of various external inputs such as a part (e.g., a finger) of a user's body, a stylus pen, light, heat, and pressure. In addition, the external input may include an approaching spatial touch (e.g., a hovering touch) as well as the actual touch of the part of the user's body.

The input sensing unit ISU may be disposed directly on the display panel DP. In the present specification, it is understood that when a component 'A' is disposed directly on a component 'B', an adhesive layer is not disposed between the component 'A' and the component 'B'. In other words, the term 'directly' may mean that there is no intervening component between 'A' and 'B'. In an exemplary embodiment, the input sensing unit ISU may be integrally formed with the display panel DP by continuous manufacturing processes. However, the inventive concepts are not limited thereto. In another exemplary embodiment, the input sensing unit ISU may be provided as an individual panel and then may be coupled to the display panel DP by an adhesive layer. In still another exemplary embodiment, the input sensing unit ISU may be omitted.

The circuit board FB may be connected to an end of the display panel DP to transmit driving signals to the display panel DP. In some exemplary embodiments, the circuit board FB may be a flexible printed circuit board, and the driving signals may be signals for displaying an image on the display panel DP. In addition, even though not shown in the drawings, a driving circuit board for providing the driving signals may be connected to an end of the circuit board FB. The circuit board FB may be disposed between the display panel DP and the driving circuit board and may transmit the driving signals provided from the driving circuit board to the display panel DP.

The structure in which the circuit board FB is connected to the display panel DP is simply illustrated in FIG. 2. However, the inventive concepts are not limited thereto. In another exemplary embodiment, the display device DD may further include a touch circuit board connected to the input sensing unit ISU. The touch circuit board may provide touch driving signals to the input sensing unit ISU. In an exemplary embodiment, a bonding method of connecting the circuit board FB and the display panel DP may be substantially the same as a bonding method of connecting the touch circuit board and the input sensing unit ISU.

The receiving member BC may be coupled to the window WM. The receiving member BC may provide a rear surface of the display device DD and define an inner space and may be coupled to the window WM through the inner space. The receiving member BC may include or be formed of a material having relatively high rigidity. For example, the receiving member BC may include a plurality of frames and/or plates, which are formed of glass, plastic, and/or a metal. The receiving member BC may stably protect the components of the display device DD, which are accommodated in the inner space, from an external impact.

In the above description, the receiving member BC may include or be formed of the material having the high rigidity. However, the inventive concepts are not limited thereto. In another exemplary embodiment, the receiving member BC may include or be formed of a flexible material. Even though not shown in the drawings, the display device DD according to certain exemplary embodiments of the inventive concepts may be foldable or bendable. Thus, at least some components included in the display device DD may also have flexibility.

Figure 3:
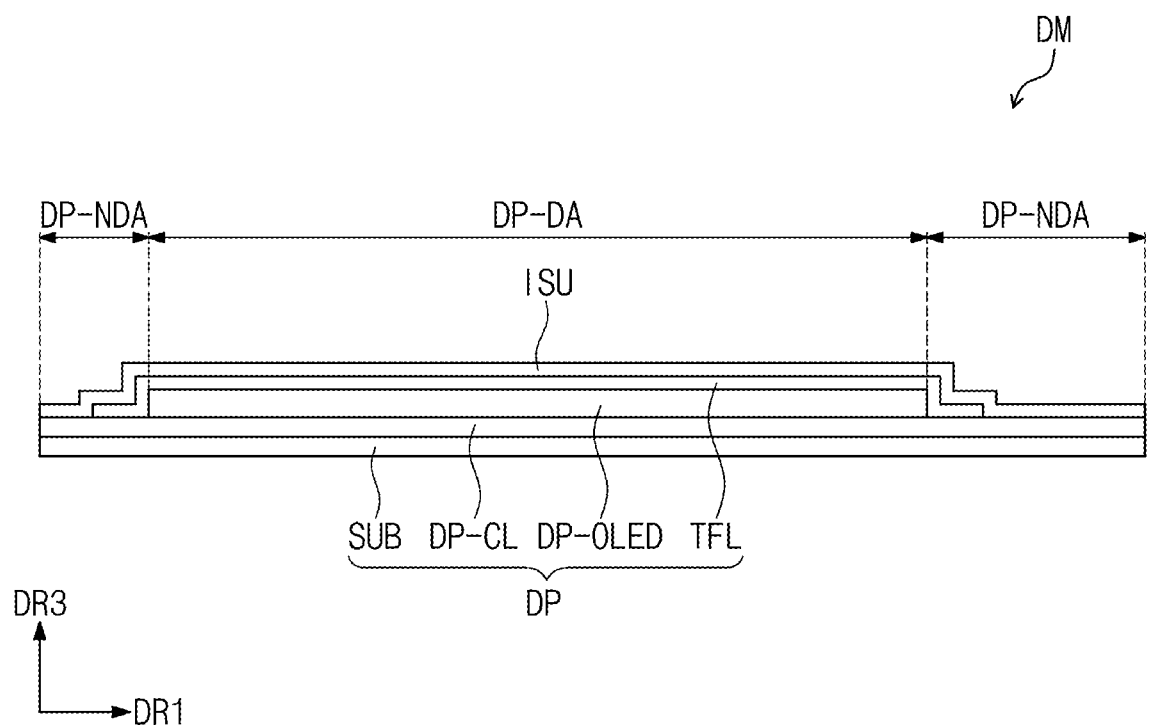
FIG. 3 is a cross-sectional view illustrating an exemplary embodiment of a display module according to the inventive concepts.

FIG. 3 is a cross-sectional view illustrating an exemplary embodiment of a display module according to the inventive concepts.

Referring to FIG. 3, the display panel DP may include a base substrate SUB, a circuit element layer DP-CL, a display element layer DP-OLED, and an insulating layer TFL. The circuit element layer DP-CL, the display element layer DP-OLED and the insulating layer TFL may be disposed on the base substrate SUB.

The base substrate SUB may include at least one plastic film. The base substrate SUB may be a flexible substrate and/or may include a plastic substrate, a glass substrate, a metal substrate, or an organic/inorganic composite substrate, for example. The display area DD-DA and the non-display area DD-NDA described with reference to FIG. 1 may correspond to a display area DP-DA and a non-display area DP-NDA defined in the base substrate SUB, respectively. The base substrate SUB may be referred to as a display substrate.

The circuit element layer DP-CL may include at least one intermediate insulating layer and a circuit element. The intermediate insulating layer may include at least one intermediate inorganic layer and at least one intermediate organic layer. The circuit element may include signal lines and a driving circuit of a pixel.

The display element layer DP-OLED may include a plurality of organic light emitting diodes. The display element layer DP-OLED may further include an organic layer such as a pixel defining layer. In another exemplary embodiment, in a case that the display panel DP is the liquid crystal display panel, the display element layer may include a liquid crystal layer.

The insulating layer TFL may encapsulate the display element layer DP-OLED. For example, the insulating layer TFL may be a thin-film-encapsulation layer. The insulating layer TFL may protect the display element layer DP-OLED from foreign materials such as moisture, oxygen, and dust particles. In FIG. 3, the insulating layer TFL overlaps with the display area DP-DA and the non-display area DP-NDA in a plan view. However, the inventive concepts are not limited thereto. In another exemplary embodiment, the insulating layer TFL may not overlap with the non-display area DP-NDA.

Figure 4A:
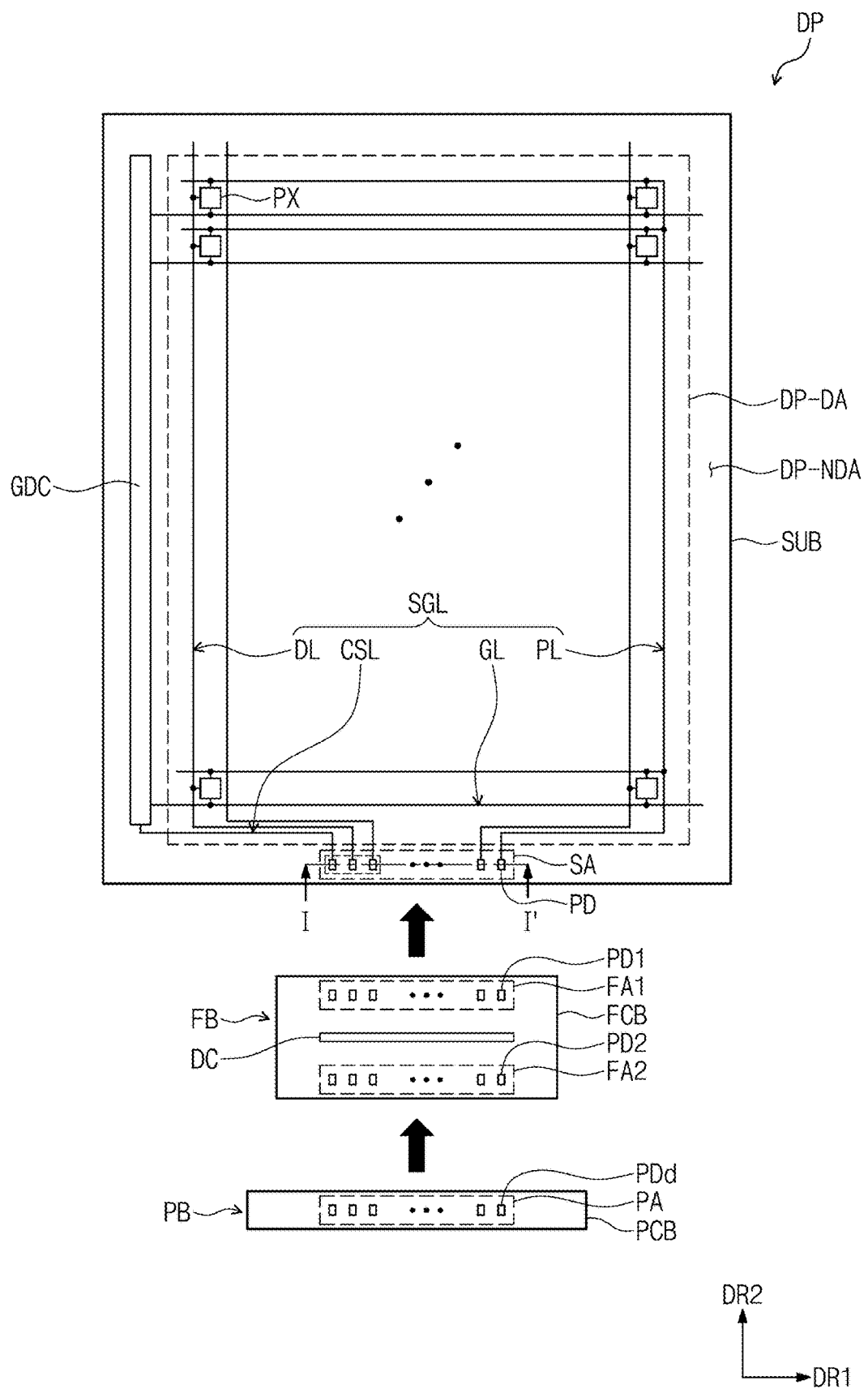
FIG. 4A is a plan view illustrating an exemplary embodiment of a display device in a state that a circuit board is separated from a display panel and a driving circuit board according to the inventive concepts.
Figure 4B:
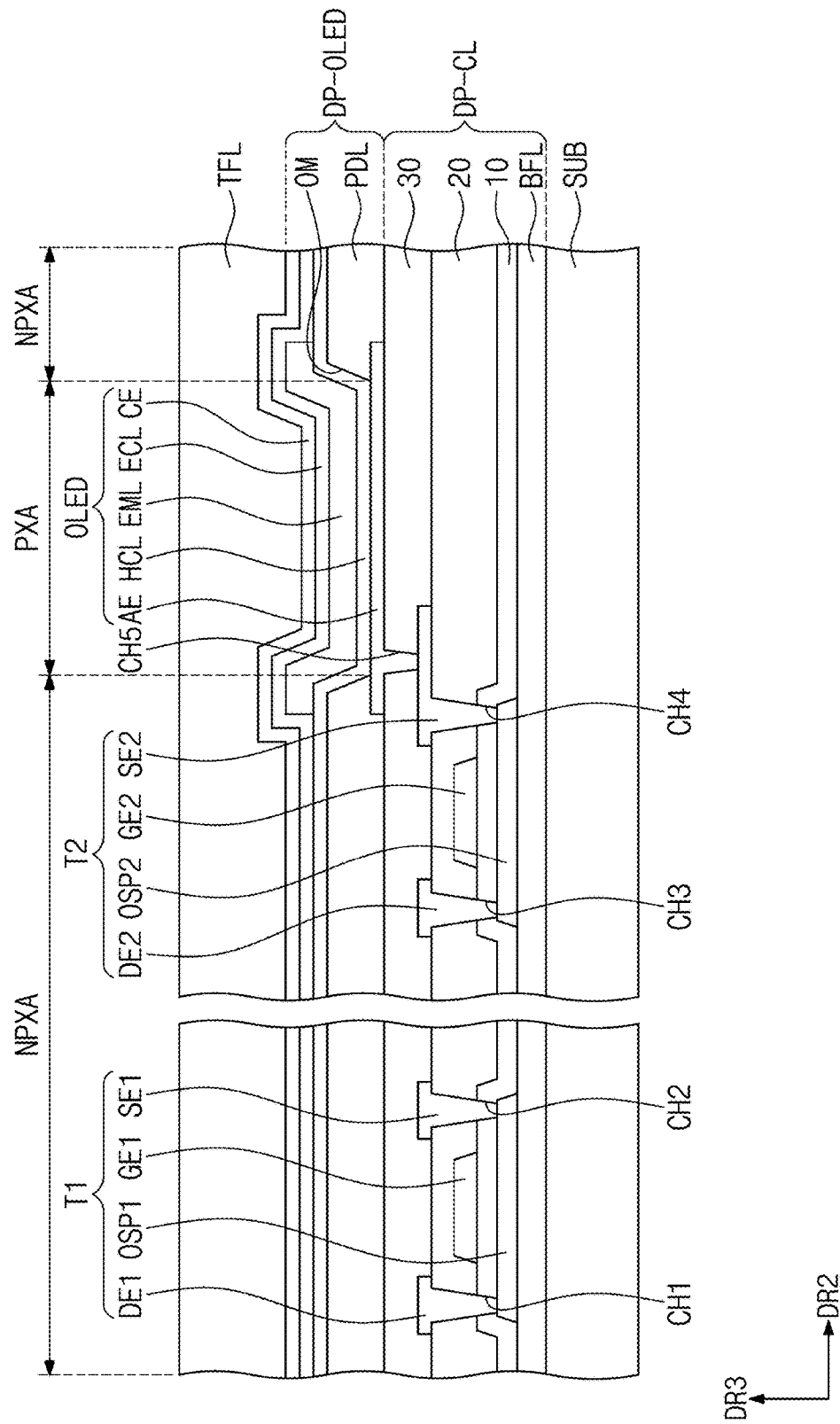
FIG. 4B is a cross-sectional view illustrating an exemplary embodiment of a portion of a display device according to the inventive concepts.

FIG. 4A is a plan view illustrating an exemplary embodiment of a display device in a state that a circuit board is separated from a display panel and a driving circuit board according to the inventive concepts. FIG. 4B is a cross-sectional view illustrating an exemplary embodiment of a portion of a display device according to the inventive concepts.

Referring to FIG. 4A, the display device DD may include the display panel DP, the circuit board FB electrically connected to the display panel DP, and a driving circuit board PB electrically connected to the circuit board FB.

The display panel DP may include a gate driving circuit GDC, a plurality of signal lines SGL, a plurality of pads PD overlapping with a pad area SA, and a plurality of pixels PX.

The pixels PX may be disposed in the display area DP-DA. Each of the pixels PX may include an organic light emitting diode and a pixel driving circuit connected to the organic light emitting diode. The gate driving circuit GDC, the signal lines SGL, the pads PD and the pixel driving circuit may be included in the circuit element layer DP-CL disposed on the base substrate SUB illustrated in FIG. 3.

The gate driving circuit GDC may generate a plurality of gate signals and may sequentially output the gate signals to a plurality of gate lines GL which will be described later. The gate driving circuit GDC may include a plurality of thin film transistors formed by the same manufacturing process (e.g., a low-temperature polycrystalline silicon ("LTPS") process or a low-temperature polycrystalline oxide ("LTPO") process) as a manufacturing process used for the pixel driving circuits of the pixels PX.

The signal lines SGL may overlap with the display area DP-DA and the non-display area DP-NDA in a plan view and may be disposed on the base substrate SUB. The signal lines SGL may include gate lines GL, data lines DL, a power line PL, and a control signal line CSL. Each of the gate lines GL may be connected to corresponding ones of the pixels PX, and each of the data lines DL may be connected to corresponding ones of the pixels PX. The power line PL may be connected to the pixels PX. The control signal line CSL may provide control signals to the gate driving circuit GDC.

The circuit board FB may include a first board FCB, first connection pads PD1, second connection pads PD2, and a driving chip DC. The circuit board FB may be connected to an end of the display panel DP and an end of the driving circuit board PB. As described above, the circuit board FB may be a flexible printed circuit board. For example, as illustrated in FIG. 2, the circuit board FB may be bent along a side surface of the display panel DP, and thus a portion of the circuit board FB may be disposed on a rear surface of the display panel DP, and another portion of the circuit board FB may be disposed on a front surface of the display panel DP.

FIG. 4A illustrates a state in which the circuit board FB is separated from the display panel DP and the driving circuit board PB. However, the circuit board FB may be connected to a portion of the non-display area DP-NDA of the display panel DP and a portion of the driving circuit board PB in other states.

A first pad area FA1 and a second pad area FA2 may be defined in the first board FCB. The first connection pads PD1 may be disposed in the first pad area FA1, and the second connection pads PD2 may be disposed in the second pad area FA2. The first connection pads PD1 may be spaced apart from each other in the first direction DR1, and the second connection pads PD2 may be spaced apart from each other in the first direction DR1. The second connection pads PD2 may be spaced apart from the first connection pads PD1 in the second direction DR2.

In a case that the circuit board FB is bonded to the display panel DP, the pad area SA and the first pad area FA1 may overlap with each other. In an exemplary embodiment, the first connection pads PD1 may be electrically bonded to the pads PD of the display panel DP, respectively. Thus, a plurality of driving signals transmitted from the first connection pads PD1 may be transmitted to the pixels PX of the display panel DP through the pads PD.

According to an exemplary embodiment of the inventive concepts, the pads PD of the display panel DP may be bonded to the first connection pads PD1 of the circuit board FB, respectively, by an ultrasonic bonding method. The ultrasonic bonding method may mean that two metal materials are bonded directly to each other by pressure and ultrasonic vibration. As a result, the pads PD may be in contact with the first connection pads PD1, respectively, and may be electrically connected to the first connection pads PD1, respectively.

The driving circuit board PB may include a second board PCB and driving pads PDd disposed on the second board PCB. The driving pads PDd may be disposed in a driving pad area PA defined in the second board PCB.

When the first board FCB of the circuit board FB is bonded to the second board PCB of the driving circuit board PB, the driving pad area PA and the second pad area FA2 may overlap with each other. In an exemplary embodiment, the second connection pads PD2 of the circuit board FB may be electrically bonded to the driving pads PDd of the driving circuit board PB, respectively. Thus, the driving signals outputted from the driving pads PDd of the driving circuit board PB may be transmitted to the second connection pads PD2 of the circuit board FB.

According to an exemplary embodiment of the inventive concepts, the second connection pads PD2 of the circuit board FB may be bonded to the driving pads PDd of the driving circuit board PB, respectively, by the ultrasonic bonding method. As a result, the driving pads PDd may be in contact with the second connection pads PD2, respectively, and may be electrically connected to the second connection pads PD2, respectively.

The driving chip DC may be disposed between the first connection pads PD1 and the second connection pads PD2. In other words, the first connection pads PD1 may be spaced apart from the second connection pads PD2 with the driving chip DC interposed therebetween.

The driving chip DC may receive the driving signals transmitted from the driving circuit board PB through the second connection pads PD2 and may output data signals, to be provided to the pixels PX, based on the received driving signals. The data signals may be transmitted to the pads PD through the first connection pads PD1. The pads PD may transmit the data signals transmitted from the driving chip DC to the data lines DL of the signal lines SGL, respectively.

In this exemplary embodiment, the first connection pads PD1 and the second connection pads PD2 of the circuit board FB are bonded to other pads by the ultrasonic bonding method. However, the inventive concepts are not limited thereto. In other exemplary embodiments, one group of the first connection pads PD1 and the second connection pads PD2 of the circuit board FB may be bonded to other pads by the ultrasonic bonding method, and the other group thereof may be bonded to still other pads by an adhesive material. For example, the adhesive material may be an anisotropic conductive film ("ACF").

In addition, the circuit board FB may be disposed on the base substrate SUB which does not overlap with the display element layer DP-OLED of FIG. 3 but overlaps with the non-display area DP-NDA in a plan view.

Referring to FIG. 4B, the circuit element layer DP-CL may be disposed on the base substrate SUB.

The circuit element layer DP-CL may include at least one insulating layer and the circuit element. The circuit element may include the signal lines and the pixel driving circuit of the pixel PX. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

The circuit element layer DP-CL may include a buffer layer BFL corresponding to an inorganic layer, a first intermediate inorganic layer 10, a second intermediate inorganic layer 20, and an intermediate organic layer 30. In an exemplary embodiment, the buffer layer BFL may include a plurality of stacked inorganic layers.

In an exemplary embodiment, the pixel driving circuit of the pixel PX may include at least two transistors T1 and T2 for driving an organic light emitting diode OLED of the display element layer DP-OLED. In FIG. 4B, a switching transistor T1 and a driving transistor T2 are illustrated as an example. The switching transistor T1 may be connected to the gate line GL and the data line DL and may control an operation of the driving transistor T2. The driving transistor T2 may be connected to the organic light emitting diode OLED of the display element layer DP-OLED and may control an operation of the organic light emitting diode OLED.

The switching transistor T1 may include a first semiconductor pattern OSP1, a first control electrode GE1, a first input electrode DE1, and a first output electrode SE1, and the driving transistor T2 may include a second semiconductor pattern OSP2, a second control electrode GE2, a second input electrode DE2, and a second output electrode SE2.

First and second through-holes CH1 and CH2 may be defined in the circuit element layer DP-CL to connect the first input electrode DE1 and the first output electrode SE1 of the switching transistor T1 to the first semiconductor pattern OSP1 of the switching transistor T1, respectively. Third and fourth through-holes CH3 and CH4 may be defined in the circuit element layer DP-CL to connect the second input electrode DE2 and the second output electrode SE2 of the driving transistor T2 to the second semiconductor pattern OSP2 of the driving transistor T2, respectively.

The display element layer DP-OLED may include the organic light emitting diode OLED. The display element layer DP-OLED may include a pixel defining layer PDL. For example, the pixel defining layer PDL may be an organic layer.

A first electrode AE may be disposed on the intermediate organic layer 30. The first electrode AE may be connected to the second output electrode SE2 through a fifth through-hole CH5 penetrating the intermediate organic layer 30. An opening OM may be defined in the pixel defining layer PDL. The opening OM of the pixel defining layer PDL may expose at least a portion of the first electrode AE. The opening OM of the pixel defining layer PDL may be referred to as an emission opening to distinguish it from other openings.

Even though not shown in the drawings, a spacer overlapping with a portion of the pixel defining layer PDL may be disposed on a top surface of the pixel defining layer PDL. The spacer and the pixel defining layer PDL may constitute a single unitary body, or the spacer may be an insulating structure formed by an additional process.

The display panel DP may include a light emitting area PXA and a non-light emitting area NPXA adjacent to the light emitting area PXA. The non-light emitting area NPXA may surround the light emitting area PXA. In an exemplary embodiment, the light emitting area PXA is defined to correspond to a portion of the first electrode AE, which is exposed through the emission opening OM.

A hole control layer HCL may be disposed in common in the light emitting area PXA and the non-light emitting area NPXA, and disposed on the first electrode AE and the pixel defining layer PDL. The hole control layer HCL may include a hole transfer layer and may further include a hole injection layer. An emission layer EML may be disposed on the hole control layer HCL. The emission layer EML may be disposed in an area corresponding to the emission opening OM. In other words, the emission layers EML of the pixels PX may be separated from each other. That is, the emission layer EML of one of the pixels PX may not be connected to the emission layer EML of another of the pixels PX. The emission layer EML may include an organic material and/or an inorganic material. The emission layer EML may generate light having a predetermined color.

An electron control layer ECL may be disposed on the emission layer EML. The electron control layer ECL may include an electron transfer layer and may further include an electron injection layer. The hole control layer HCL and the electron control layer ECL may be formed in common in the plurality of pixels PX by using an open mask. A second electrode CE may be disposed on the electron control layer ECL. The second electrode CE may have a single unitary body shape and may be disposed in common in the plurality of pixels PX.

The insulating layer TFL may be disposed on the second electrode CE. The insulating layer TFL may be a single encapsulation layer or may include a plurality of thin films.

Figure 5:
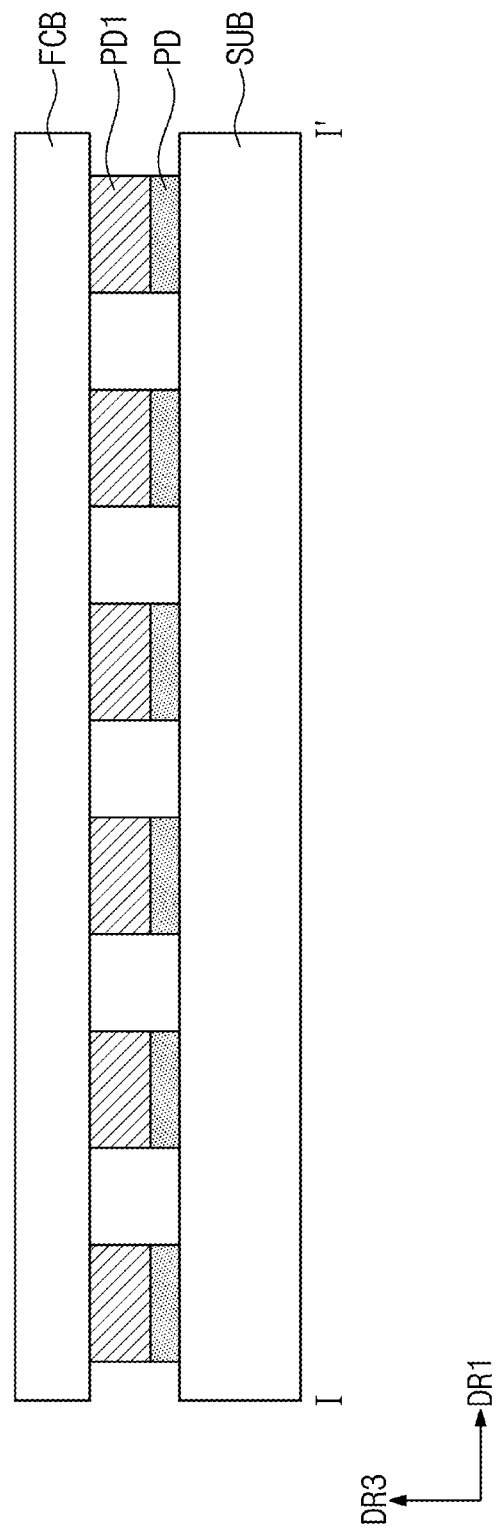
FIG. 5 is a cross-sectional view taken along line I-I' of FIG. 4A.
Figure 6:
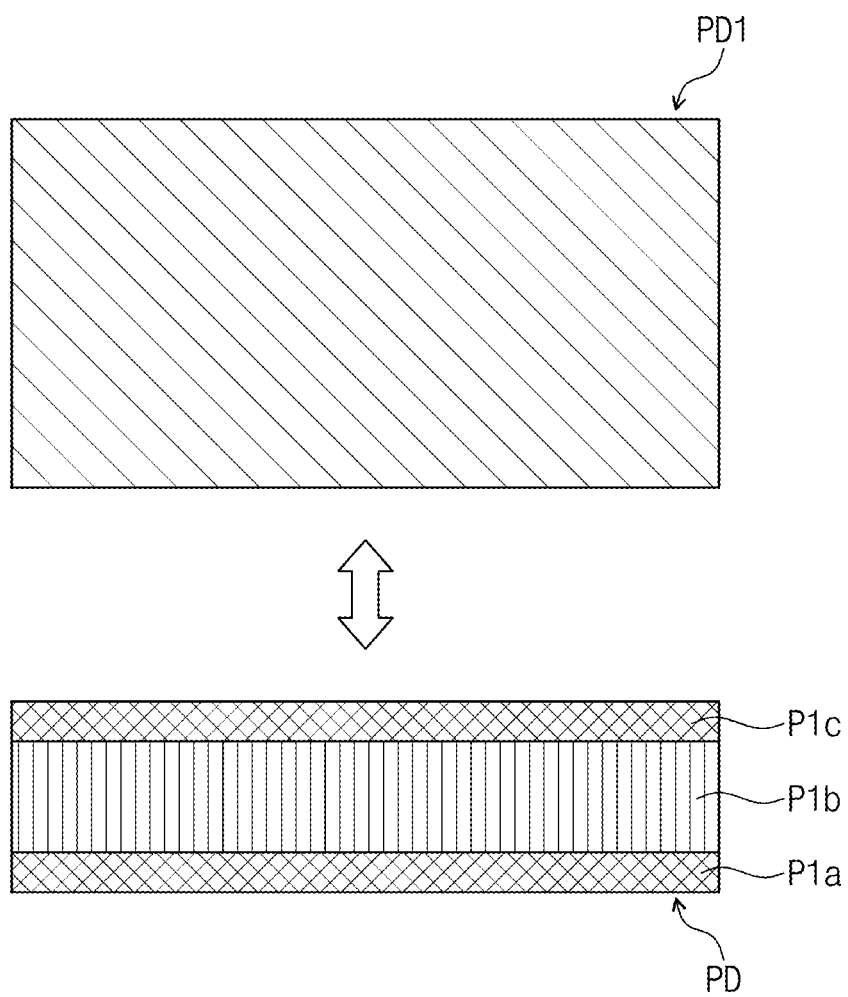
FIG. 6 is a schematic view illustrating an exemplary embodiment of bonding of a pad and a first connection pad according to the inventive concepts.

FIG. 5 is a cross-sectional view taken along line I-I' of FIG. 4A. FIG. 6 is a schematic view illustrating an exemplary embodiment of bonding of a pad of a display panel and a first connection pad of a circuit board according to the inventive concepts.

Referring to FIG. 5, the base substrate SUB may face the first board FCB in the third direction DR3. The pad PD disposed on the base substrate SUB and the first connection pad PD1 disposed on the first board FCB may face each other in the third direction DR3 and may be in contact with each other. As described above with reference to FIG. 4A, the pads PD of the display panel DP may be connected directly to the first connection pads PD1 of the circuit board FB by the ultrasonic bonding method.

Referring to FIG. 6, the first connection pad PD1 according to an exemplary embodiment may consist of or be formed of a conductive layer of a single material and may consist of or be formed of a metal material which can be easily bonded to the pad PD by the ultrasonic bonding method. For example, the first connection pad PD1 may be formed of copper (Cu).

The pad PD may include a first driving conductive layer P1a, a second driving conductive layer P1b, and a third driving conductive layer P1c. The first driving conductive layer P1a may be disposed on the base substrate SUB. In particular, the first driving conductive layer P1a may be disposed directly on the base substrate SUB. The second driving conductive layer P1b may be disposed on the first driving conductive layer P1a, and the third driving conductive layer P1c may be disposed on the second driving conductive layer P1b.

According to an exemplary embodiment of the inventive concepts, the first driving conductive layer P1a and the third driving conductive layer P1c may include or be formed of the same material. For example, each of the first and third driving conductive layers P1a and P1c may include or be formed of titanium (Ti), and the second driving conductive layer P1b may include or be formed of aluminum (Al). According to an exemplary embodiment of the inventive concepts, a thickness of the second driving conductive layer P1b in the third direction DR3 may be greater than a thickness of each of the first and third driving conductive layers P1a and P1c in the third direction DR3.

The first driving conductive layer P1a of titanium may be easily bonded to the base substrate SUB of a glass substrate and the second driving conductive layer P1b of aluminum by the ultrasonic bonding method. In addition, the third driving conductive layer P1c of titanium may be easily bonded to the second driving conductive layer P1b of aluminum by the ultrasonic bonding method.

According to an exemplary embodiment of the inventive concepts, the third driving conductive layer P1c of titanium (Ti) may be bonded to the first connection pad PD1 of copper (Cu) by the ultrasonic bonding method. In addition, even though not shown in the drawings, when the first connection pad PD1 is connected to the third driving conductive layer P1c by the ultrasonic bonding between the first connection pad PD1 and the pad PD, at least a portion of the second driving conductive layer P1b may be adhered or bonded to the first connection pad PD1.

Figure 7:
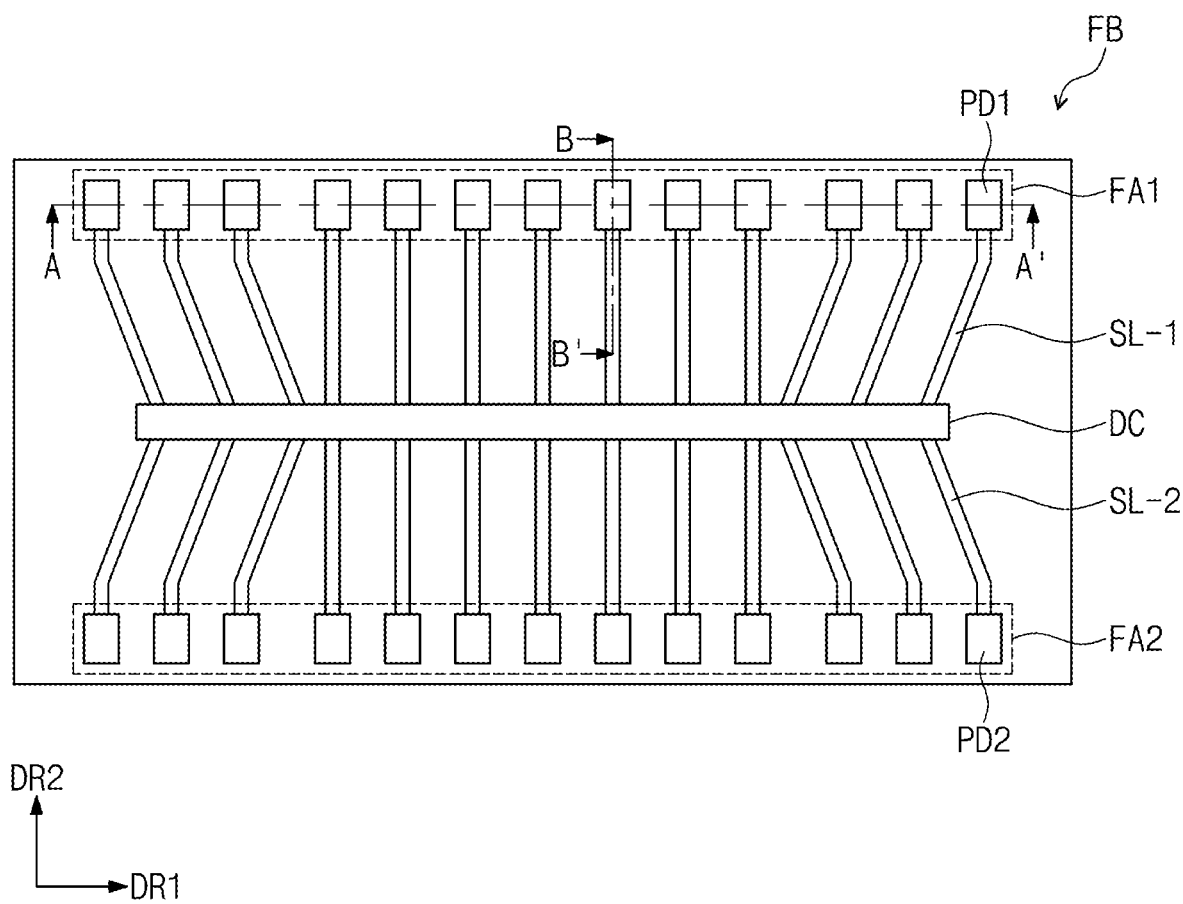
FIG. 7 is a plan view illustrating an exemplary embodiment of a circuit board of FIG. 4A.

FIG. 7 is a plan view illustrating an exemplary embodiment of a circuit board of FIG. 4A.

Referring to FIG. 7, the circuit board FB may further include first signal lines SL-1 and second signal lines SL-2 not shown in the circuit board FB of FIG. 4A.

The first signal lines SL-1 may be disposed between the driving chip DC and the first connection pads PD1 to electrically connect the first connection pads PD1 to the driving chip DC. First ends of the first signal lines SL-1 may be connected to the first connection pads PD1, and second ends of the first signal lines SL-1 may be connected to the driving chip DC.

The second signal lines SL-2 may be disposed between the driving chip DC and the second connection pads PD2 to electrically connect the second connection pads PD2 to the driving chip DC. First ends of the second signal lines SL-2 may be connected to the second connection pads PD2, and second ends of the second signal lines SL-2 may be connected to the driving chip DC.

FIGS. 8A to 8E are cross-sectional views illustrating an exemplary embodiment of a method for manufacturing a circuit board according to the inventive concepts.

FIGS. 8A to 8E illustrate processes for manufacturing the circuit board FB including the first connection pads PD1 of FIG. 7. In addition, even though not shown in the drawings, the second connection pads PD2 may also be formed through the processes illustrated in FIGS. 8A to 8E.

Referring to FIG. 8A, a conductive layer CS may be formed on the first board FCB, and a photoresist layer PR may be formed on the conductive layer CS. The conductive layer CS may include or be formed of a conductive material for forming the first connection pads PD1. A mask MK may be disposed spaced apart from the photoresist layer PR. The photoresist layer PR may be partially exposed using the mask MK (hereinafter "exposure process EXL").

The mask MK may define a plurality of openings SO, and a portion of the photoresist layer PR which overlaps with the openings SO in a plan view may be removed through the exposure process EXL. For example, the openings SO may overlap with areas between the first connection pads PD1 of FIG. 7.

Referring to FIG. 8B, the photoresist layer PR after the portion above is removed through the exposure process EXL may be shown. Thereafter, a portion of the conductive layer CS may be removed by an etching process. For example, the portion of the conductive layer CS may be removed by a dry etching process or a wet etching process. The first connection pads PD1 may be formed by the removal of the portion of the conductive layer CS through the etching process.

Thereafter, other portions of the photoresist layer PR which are disposed on the first connection pads PD1 may be removed. The other portions of the photoresist layer PR may be remaining portions of the photoresist layer PR except the portion of the photoresist layer PR removed above through the exposure process EXL.

Even though not shown in the drawings, the conductive layer CS may be disposed not only on the first pad area FA1 but also on the whole of the first board FCB. In other words, the conductive layer CS may be commonly used as a material for forming the first connection pads PD1, the second connection pads PD2, the first signal lines SL-1 and the second signal lines SL-2 of FIG. 7. The first connection pads PD1, the second connection pads PD2, the first signal lines SL-1 and the second signal lines SL-2 may be formed at the same time by the processes described with reference to FIGS. 8A and 8B.

As described above, the first connection pads PD1 may be formed on the first board FCB through the processes described with reference to FIGS. 8A and 8B. The first connection pads PD1 may be disposed in the first pad area FA1 illustrated in FIG. 7 and may be arranged in the first direction DR1 at equal distances.

Referring to FIG. 8C, an adhesive layer HD may be formed on the first board FCB to overlap with the entire first connection pads PD1 in a plan view. According to an exemplary embodiment of the inventive concepts, the adhesive layer HD may overlap with the whole of the first pad area FA1.

In the exemplary embodiment illustrated in FIG. 8C, the adhesive layer HD may be formed on the entire first connection pads PD1 and may be formed directly on the first board FCB between the first connection pads PD1 to overlap with the entire areas between the first connection pads PD1. In particular, a thickness D1 of the adhesive layer HD overlapping with the area between the first connection pads PD1 may be greater than a thickness D2 of the first connection pad PD1 in the third direction DR3. A top surface of a portion of the adhesive layer HD formed on the first connection pad PD1 and a top surface of a portion of the adhesive layer HD overlapping with the area between the first connection pads PD1 may be located at substantially the same height (or level) from the first board FCB.

According to an exemplary embodiment of the inventive concepts, the adhesive layer HD may include or be formed of a high-temperature detachable adhesive and may maintain its adhesive strength in a temperature range of about 250 degrees Celsius to about 500 degrees Celsius. In addition, the adhesive layer HD of FIG. 8C may be formed by applying an adhesive material onto the first board FCB.

Figure 8D:
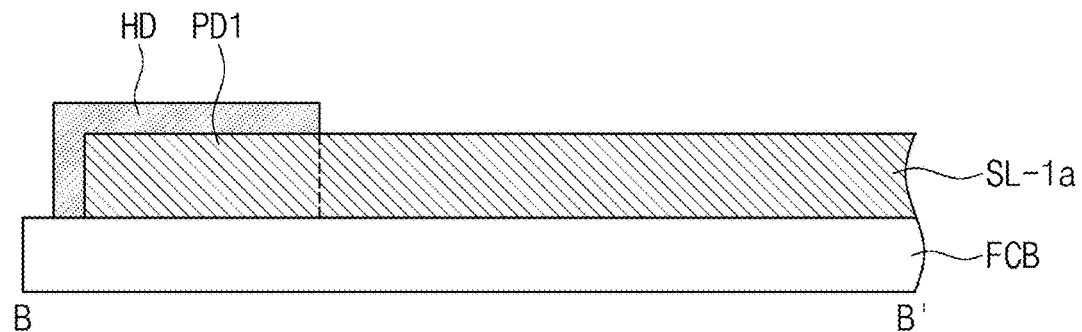
Figure 8E:
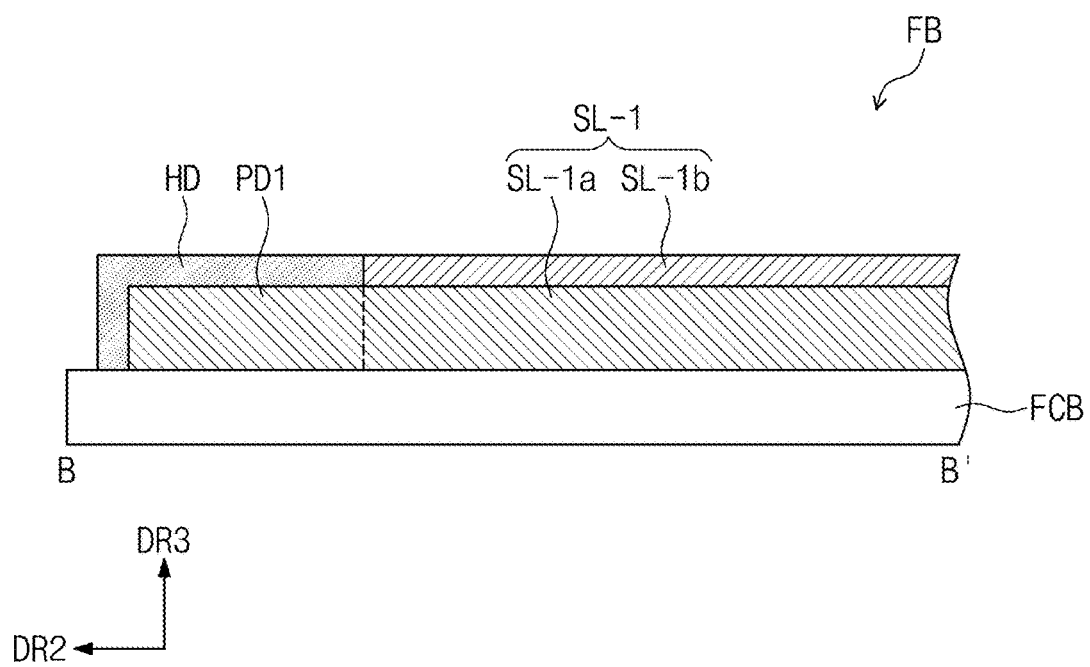

FIGS. 8D and 8E are cross-sectional views taken along line B-B' of FIG. 7 to illustrate one of the first connection pads PD1 and one of the first signal lines SL-1, which are connected to each other, as an example. Hereinafter, the first connection pad PD1 may be referred to as a first conductive pad, and the first signal line SL-1 may include a first conductive line and a second conductive line. In addition, the first conductive line may be defined as a first line layer, and the second conductive line may be defined as a second line layer.

Referring to FIG. 8D, the first conductive line SL-1a of the first signal line SL-1 and the first conductive pad PD1 may be formed on the first board FCB at the same time by the processes described with reference to FIGS. 8A and 8B. Thus, the first conductive line SL-1a and the first conductive pad PD1 may include or be formed of the same material and may constitute a single unitary body. For example, the first conductive line SL-1a and the first conductive pad PD1 may include or be formed of copper (Cu).

In an exemplary embodiment, the adhesive layer HD may not overlap with the first conductive line SL-1a but may overlap with the first conductive pad PD1 in a plan view. In other words, the adhesive layer HD may be disposed on an entire top surface and an entire side surface of the first conductive pad PD1 except for the first conductive line SL-1a.

Referring to FIG. 8E, the second conductive line SL-1b may be formed on the first conductive line SL-1a. The second conductive line SL-1b may include or be formed of a different material from that of the first conductive line SL-1a and may be formed by a process different from the process of forming the first conductive line SL-1a. A thickness of the second conductive line SL-1b may be less than a thickness of the first conductive line SL-1a in the third direction DR3, and the second conductive line SL-1b may prevent oxidation reaction between the first conductive line SL-1a and the outside. A portion of the second conductive line SL-1b may be adhered to the adhesive layer HD.

In an exemplary embodiment, the second conductive line SL-1b may include or be formed of tin (Sn). In particular, the second conductive line SL-1b may be formed on the first conductive line SL-1a after the formation of the adhesive layer HD, for example. The second conductive line SL-1b may be formed on the first conductive line SL-1a by completely dipping the first board FCB into a container filled with a material of the second conductive line SL-1b.

A temperature of the material of the second conductive line SL-1b may be about 250 degrees Celsius in the container when forming the second conductive line SL-1b. Since the adhesive layer HD maintains its adhesive strength at a temperature of 500 degrees Celsius or less, the adhesive strength of the adhesive layer HD may be maintained even though the first board FCB is completely dipped in the container. In addition, the material of the second conductive line SL-1b, which includes or is formed of tin (Sn), may not be formed directly on the first board FCB (e.g., a glass substrate) and the adhesive layer HD having the adhesive property.

As described above, the circuit board FB according to the present exemplary embodiment may have the structure in which the adhesive layer HD covers the first connection pad PD1, and the structure of the first signal line SL-1 including the first conductive line SL-1a and the second conductive line SL-1b disposed on the first conductive line SL-1a as illustrated in FIG. 8E.

In addition, even though not shown in the drawings, an adhesive layer may be disposed on the second pad area FA2 in which the second connection pads PD2 of FIG. 7 are disposed. In other words, a structure of each of the second connection pads PD2 may be substantially the same as the structure of the first connection pad PD1 illustrated in FIG. 8E. Each of the second signal lines SL-2 may include a third conductive line formed by the same process as the first conductive line SL-1a and a fourth conductive line formed by the same process as the second conductive line SL-1b.

FIGS. 9A and 9B are cross-sectional views illustrating an exemplary embodiment of an ultrasonic bonding method between a circuit board and a display panel, according to the inventive concepts.

FIGS. 9A and 9B illustrate the ultrasonic bonding method between the circuit board FB manufactured through FIGS. 8A to 8E and the pads PD of the display panel DP.

As described above with reference to FIG. 8E, the adhesive layer HD may be formed on the first connection pad PD1, and thus the material of the second conductive line SL-1b may not be formed on the first connection pad PD1 in the formation stage of the second conductive line SL-1b. In other words, the second conductive line SL-1b may not overlap with the first connection pad PD1 in a plan view.

Referring to FIG. 9A, the adhesive layer HD disposed on the first connection pads PD1 may be removed for the ultrasonic bonding with the pads PD of the display panel DP. The adhesive layer HD may be detached from the first board FCB and the first connection pads PD1 by external physical force. Since the adhesive layer HD is detached from the first connection pads PD1, the first connection pads PD1 may be exposed to the outside.

The second conductive line SL-1b including or formed of tin (Sn) may not be easily bonded to the third driving conductive layer P1c (e.g., titanium (Ti)) of the pad PD by the ultrasonic bonding method. Thus, if the material of the second conductive line SL-1b is disposed on the first connection pad PD1, the ultrasonic bonding between the first connection pad PD1 and the pad PD may not be easy. However, according to an exemplary embodiment of the inventive concepts, the adhesive layer HD may prevent the second conductive line SL-1b from being formed on the first connection pad PD1. Thus, the first connection pad PD1 including or formed of copper (Cu) may be bonded to the third driving conductive layer P1c of the pad PD by the ultrasonic bonding method. Here, the first connection pad PD1 may not include tin (Sn).

Referring to FIG. 9B, the ultrasonic bonding between the first connection pad PD1 and the pad PD may be performed. For example, the first connection pad PD1 including or formed of copper (Cu) may be bonded to the third driving conductive layer P1c of the pad PD including or formed of titanium (Ti) by pressure and ultrasonic vibrations UWV. As a result, the pads PD may be in contact with the first connection pads PD1, respectively, and may be electrically connected to the first connection pads PD1, respectively.

FIGS. 10A to 10D are cross-sectional views illustrating another exemplary embodiment of a method for manufacturing a circuit board according to the inventive concepts.

Figure 10A:
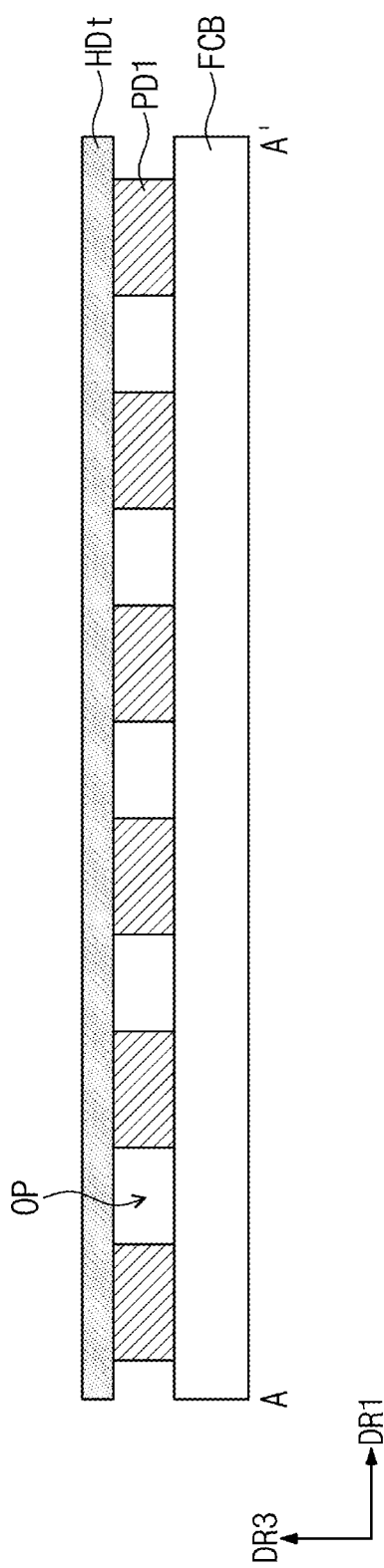
FIGS. 10A to 10D are cross-sectional views illustrating another exemplary embodiment of a method for manufacturing a circuit board according to the inventive concepts.

Referring to FIG. 10A, an adhesive layer HDt may be disposed spaced apart from the first board FCB, unlike the adhesive layer HD illustrated in FIG. 8C. Thus, an inner space OP may be defined between the adhesive layer HDt and the first board FCB. The inner space OP may mean a space between the first connection pads PD1. The inner space OP does not be filled with the adhesive layer HDt.

According to an exemplary embodiment of the inventive concepts, the adhesive layer HDt may overlap with the whole of the first pad area FA1 illustrated in FIG. 7. For example, the adhesive layer HDt may be provided in a tape shape and may be disposed on the first connection pads PD1.

Figure 10B:
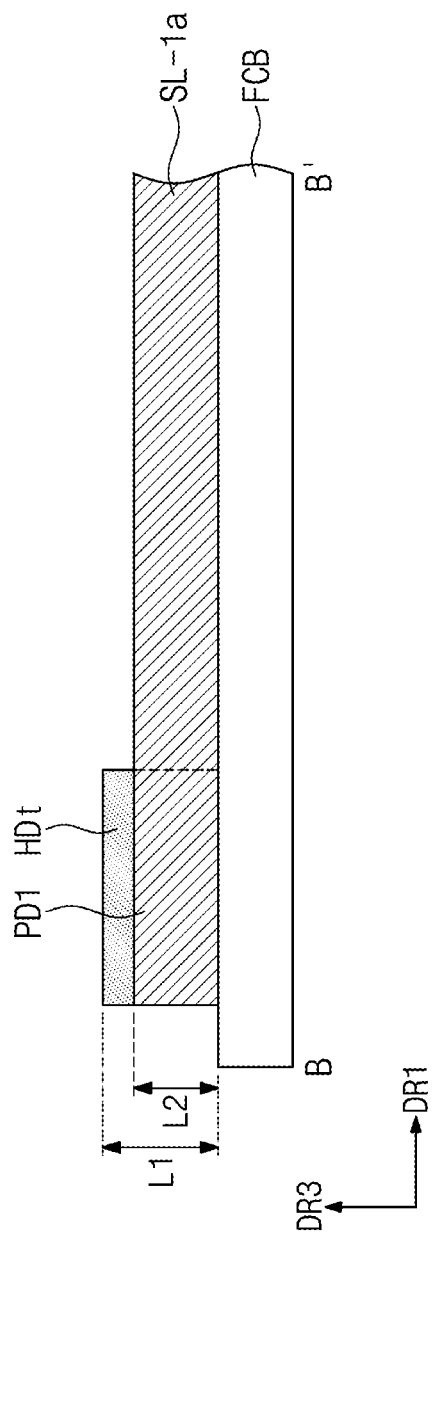

Referring to FIG. 10B, the adhesive layer HDt may not be formed on side surfaces of the first connection pads PD1. Thus, a length L1 from the first board FCB to a top surface of the adhesive layer HDt may be greater than a length L2 from the first board FCB to a top surface of the first connection pad PD1.

The process of forming the second conductive line SL-1b on the first conductive line SL-1a, described above with reference to FIG. 8E, may also be performed after the adhesive layer HDt is disposed on the first connection pads PD1 in this exemplary embodiment.

Figure 10C:
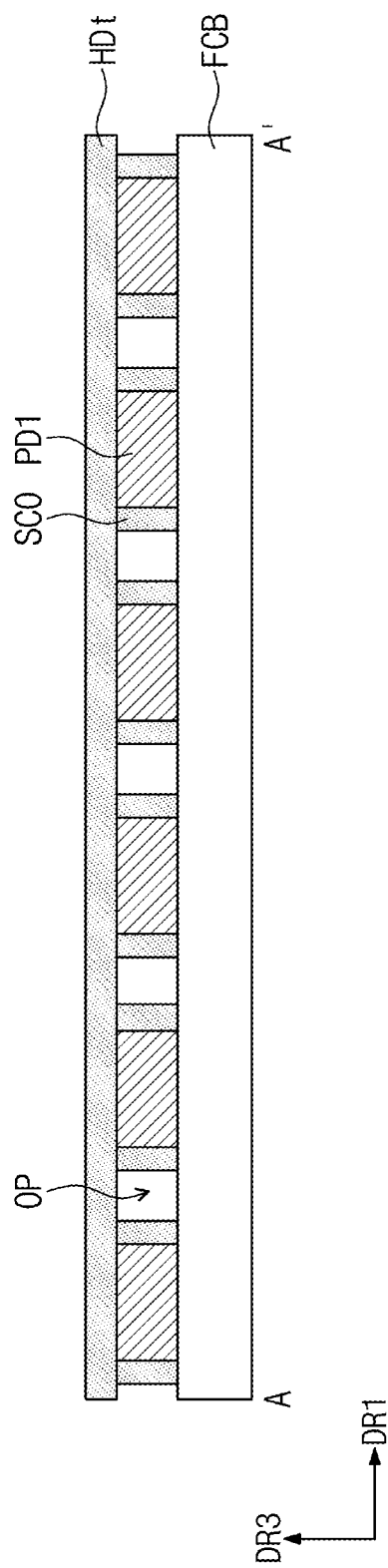
Figure 10D:
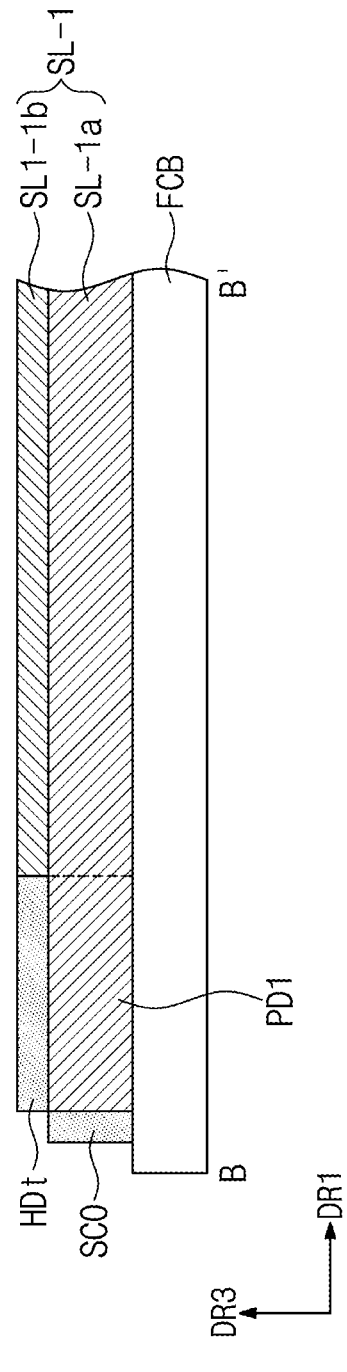

Referring to FIGS. 10C and 10D, an auxiliary conductive layer SCO having the same material as the second conductive line SL-1b may be formed on the side surface of each of the first connection pads PD1 through the process of forming the second conductive line SL-1b.

In detail, the adhesive layer HDt of FIG. 10A may be disposed on the top surfaces of the first connection pads PD1 but may not be formed on the side surfaces of the first connection pads PD1. Here, the side surface of the first connection pad PD1 may mean an outer surface of the first connection pad PD1 between the first board FCB and the adhesive layer HDt. In other words, the side surface of the first connection pad PD1 may mean other surfaces of the first connection pad PD1 rather than the top and bottom surface of the first connection pad PD1.

Thus, when the first board FCB is completely dipped in the container filled with the material of the second conductive line SL-1b, the material of the second conductive line SL-1b may also be formed on the side surfaces of the first connection pads PD1. The material of the second conductive line SL-1b may be easily formed on the side surfaces of the first connection pads PD1 including or formed of copper (Cu). As a result, the auxiliary conductive layer SCO may be formed on the whole of the side surface of each of the first connection pads PD1, as illustrated in FIGS. 10C and 10D.

In addition, the adhesive layer HDt may also be easily detached from the first connection pads PD1 by external physical force. The first connection pads PD1 may be exposed to the outside by the detachment of the adhesive layer HDt, and thus the ultrasonic bonding between the first connection pads PD1 and the pads PD of the display panel DP may be performed.

According to the exemplary embodiments of the inventive concepts, the pad of the display panel may be bonded to the connection pad of the circuit board by the ultrasonic bonding method. Thus, it is possible to improve electrical connection characteristics between the pad of the display panel and the connection pad of the circuit board.

While the inventive concepts have been described with reference to exemplary embodiments, it will be apparent to those skilled in the art that various changes and modifications may be made without departing from the spirits and scopes of the inventive concepts. Therefore, it should be understood that the above exemplary embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A circuit board comprising:
   a board;
   first connection pads disposed on the board and arranged in a first direction;
   second connection pads disposed on the board and arranged in the first direction, the second connection pads being spaced apart from the first connection pads in a second direction perpendicular to the first direction;
   a driving chip disposed on the board and between the first connection pads and the second connection pads;
   a first adhesive layer disposed on the board and overlapping with an entirety of the first connection pads in a plan view; and
   first signals lines disposed between the driving chip and the first connection pads to electrically connect the first connection pads to the driving chip, and
   wherein each of the first signal lines comprises:
   a first line layer which consists of a same material as a material of the first connection pads and is disposed on the board; and
   a second line layer disposed on the first line layer and which consists of a different material from a material of the first line layer,
   wherein the first line layer and the first connection pad constitute a single unitary body.

2. The circuit board of claim 1, wherein the first adhesive layer overlaps with an area between the first connection pads in the plan view.

3. The circuit board of claim 2, wherein the first adhesive layer overlapping with the area between the first connection pads is disposed directly on the board, and
   wherein a thickness of the first adhesive layer overlapping with the area between the first connection pads is greater than a thickness of each of the first connection pads.

4. The circuit board of claim 2, wherein the first adhesive layer is spaced apart from the board and is disposed on the first connection pads.

5. The circuit board of claim 4, wherein each of the first connection pads comprises:
   a first conductive layer disposed between the board and the first adhesive layer; and
   a second conductive layer disposed between the board and the first adhesive layer, the second conductive layer having a different material from a material of the first conductive layer and surrounding a side surface of the first conductive layer.

6. The circuit board of claim 4, wherein the first adhesive layer has a tape shape, and
   wherein the first adhesive layer overlaps with the first connection pads in neither the first direction nor the second direction.

7. The circuit board of claim 1, wherein the first connection pads consist of a metal of a single material.

8. The circuit board of claim 7, further comprising:
   second signal lines disposed between the driving chip and the second connection pads to electrically connect the second connection pads to the driving chip.

9. The circuit board of claim 8, wherein the second connection pads consist of a metal of a single material, and the circuit board further comprising:
   a second adhesive layer overlapping with an entirety of the second connection pads in the plan view and disposed on the second connection pads.

10. The circuit board of claim 9, wherein each of the second signal lines comprises:
    a third line layer which consists of a same material as a material of the second connection pads and is disposed on the board; and
    a fourth line layer disposed on the third line layer and which consists of a different material from a material of the third line layer, wherein the third line layer and the second connection pad constitute a single unitary body.

11. The circuit board of9claim 1, wherein a thickness of the second line layer is less than a thickness of the first line layer.

12. The circuit board of claim 1, wherein the first line layer includes copper, and the second line layer include tin.

* * * * *